United States Patent [19]

Choi

[11] Patent Number: 5,773,351
[45] Date of Patent: Jun. 30, 1998

[54] ISOLATION LAYER OF SEMICONDUCTOR DEVICE AND METHOD FOR FABRICATING THE SAME

[75] Inventor: Jong Moon Choi, Seoul, Rep. of Korea

[73] Assignee: LG Semicon Co., Ltd., Chungcheongbuk-Do, Rep. of Korea

[21] Appl. No.: 740,146

[22] Filed: Oct. 22, 1996

[30] Foreign Application Priority Data

Apr. 12, 1996 [KR] Rep. of Korea ................... 1996-11069

[51] Int. Cl.$^6$ ................................................. H01L 21/76
[52] U.S. Cl. ......................... 438/429; 438/413; 438/424; 438/481
[58] Field of Search ................... 438/424, 435, 438/413, 481, 429, 430

[56] References Cited

U.S. PATENT DOCUMENTS 5,254,218 10/1993 Roberts et al. .......................... 438/424
5,472,902 12/1995 Lur .......................................... 438/435

OTHER PUBLICATIONS

"Characteristics of CMOS Device Isolation for the ULSI Age", Bryant, Andres et al., IEDM 94, pp. 671–674, 1994.

*Primary Examiner*—Trung Dang
*Attorney, Agent, or Firm*—Morgan, Lewis & Bockius LLP

[57] ABSTRACT

An isolation layer structure of a semiconductor device includes a substrate; a first insulating layer having a predetermined width and thickness which is formed in a predetermined portion of the substrate; and a second insulating layer which is formed in a predetermined portion of the substrate and which surrounds the first insulating layer.

18 Claims, 6 Drawing Sheets

F I G.2
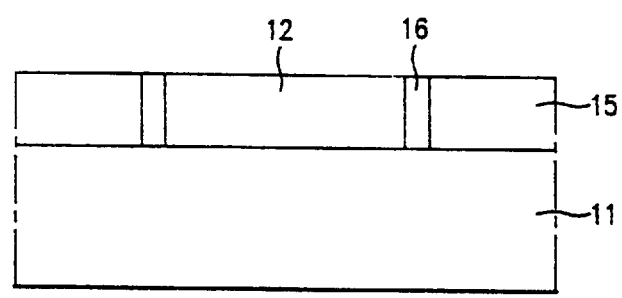

F I G.3a
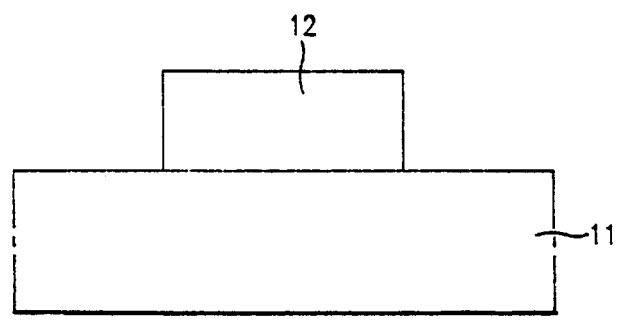
F I G.3b
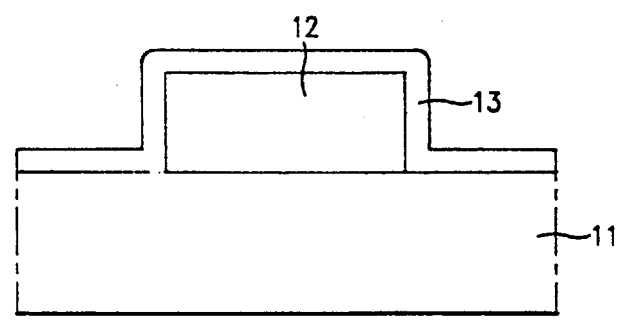
F I G.3c
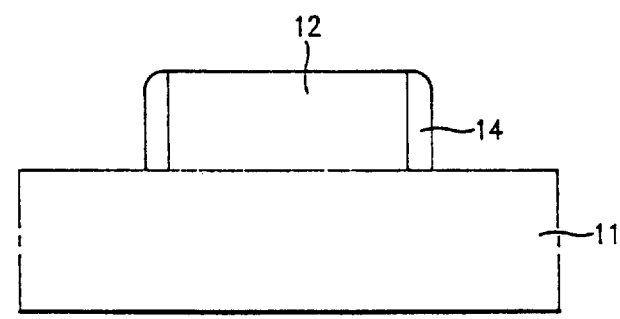
F I G.3d
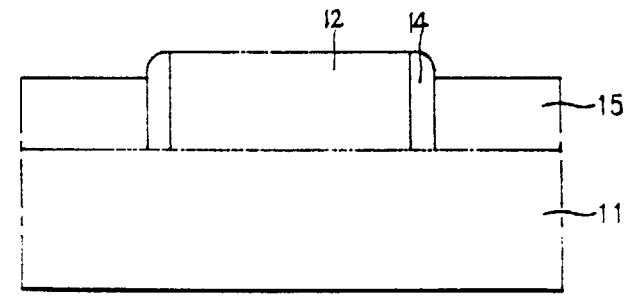

F I G.4a
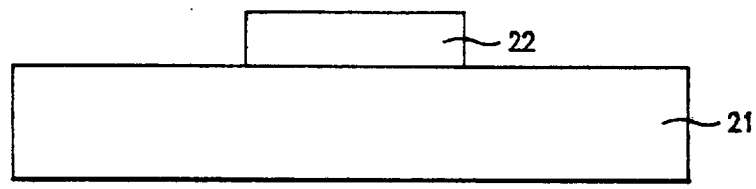
F I G.4b
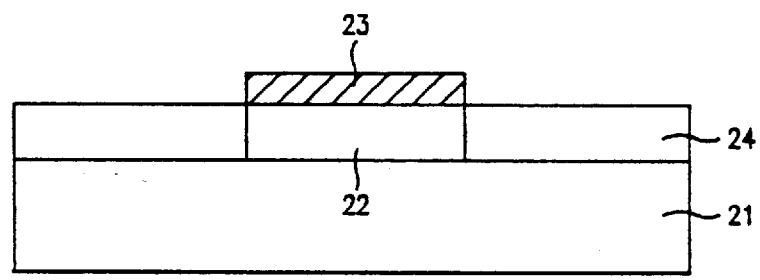
F I G.4c
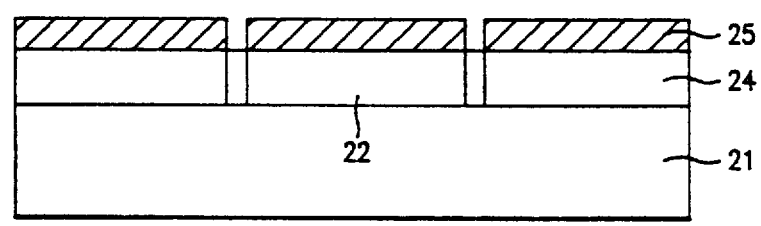
F I G.4d
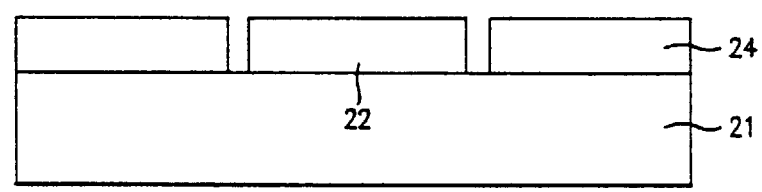
F I G.4e
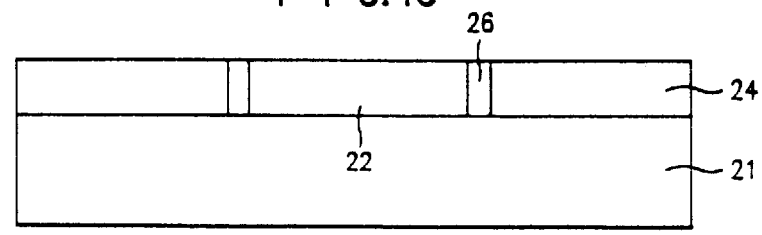

ISOLATION LAYER OF SEMICONDUCTOR DEVICE AND METHOD FOR FABRICATING THE SAME

BACKGROUND OF THE INVENTION

1. Field of the Invention

The present invention relates to an isolation layer of a semiconductor device and a method of fabricating the same. More particularly, the present invention relates to an isolation layer of a semiconductor device and a method for fabricating the same in which an oxide layer having a uniform thickness is formed to thereby improve the reliability of the semiconductor device.

2. Discussion of the Related Art

In the fabrication of a semiconductor device, a shallow trench is generally used for isolating identical devices from each other. The process for forming a shallow trench is more simplified than that of a deep trench. However, the shallow trench is not effective for preventing latch-up and isolation between p-channel and n-channel areas in CMOS devices. Accordingly, methods for fabricating an isolation layer have been proposed for the purpose of improving the isolation characteristics of these types of devices.

A conventional method for fabricating an isolation layer of a semiconductor device will be explained below with reference to the accompanying drawings. FIGS. 1a to 1d are cross-sectional views showing a process of fabricating a conventional isolation layer of the semiconductor device. As shown in FIG. 1a, a photoresist 2 is coated on a silicon substrate 1, and patterned to define a trench region. Then, as shown in FIG. 1b, silicon substrate 1 is anisotropically etched using the patterned photoresist 2 as a mask, to form a trench 3 in a predetermined portion of substrate 1.

As shown in FIG. 1c, after photoresist 2 is removed, silicon oxide layer 4 is formed on the overall surface of silicon substrate 1, including trench 3, through chemical vapor deposition (CVD). As shown in FIG. 1d, silicon oxide layer 4 is etched back so that it is left only in trench 3, to thereby form an isolation layer 4a. However, in the above-described conventional method for fabricating the isolation layer of a semiconductor device, the center of the isolation layer becomes thinner as the trench becomes wider. This results in deterioration of the reliability of the semiconductor device.

SUMMARY OF THE INVENTION

Accordingly, the present invention is directed to a isolation layer of semiconductor device and method for fabricating the same that substantially obviates one or more of the problems due to limitations and disadvantages of the related art.

It is an object of the present invention to provide an isolation layer of a semiconductor device and a method for fabricating the same, which are suitable to form an isolation layer having a uniform thickness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the isolation layer of semiconductor device and method for fabricating the same includes an isolation layer structure of a semiconductor device including a substrate; a first insulating layer having a predetermined width and thickness and being formed in a predetermined portion of the substrate; and a second insulating layer formed in a predetermined portion of the substrate to surround the first insulating layer.

The present invention also comprises an isolation layer structure of a semiconductor device including a first substrate; a second substrate formed on the first substrate; a first insulating layer formed in the second substrate; and a second insulating layer formed in the second substrate to surround the first insulating layer.

In another aspect, the method of fabricating an isolation layer structure of a semiconductor device, the method comprising the steps of: preparing a first substrate; forming a first insulating layer having a width narrower than that of the first substrate on the first substrate; forming a second substrate on the first substrate so that the second substrate has a predetermined space formed therein on each of multiple sides of the first insulating layer; and forming a second insulating layer within the spaces on the sides of the first insulating layer.

In another aspect, the method of fabricating an isolation layer structure of a semiconductor device, the method comprising the steps of: preparing a first substrate; forming a first insulating layer having a width narrower than that of the first substrate on the first substrate; crystal-growing a second substrate on an exposed portion of the first substrate; selectively removing portions of the second substrate to form a predetermined space at each of multiples sides of the first insulating layer; and forming a second insulating layer within the spaces at the sides of the first insulating layer.

In another aspect, the method of fabricating an isolation layer structure of a semiconductor device, the method comprising the steps of: preparing a first substrate; forming a first insulating layer having a width narrower than that of the first substrate on the first substrate; depositing a conductive material on an exposed portion of the first substrate, to form a second substrate; removing portions of the second substrate to form a predetermined space at each of multiple sides of the first insulating layer; and forming a second insulating layer within the spaces at the sides of the first insulating layer.

In a further aspect, the isolation structure of a semiconductor device, the isolation structure comprising: a substrate; a first insulating layer formed in a predetermined portion of the substrate; and a second insulating layer formed in the substrate at multiple sides of the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

Figure 1A:
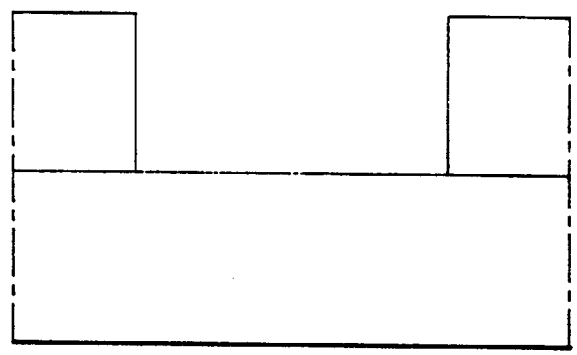
Figure 1B:
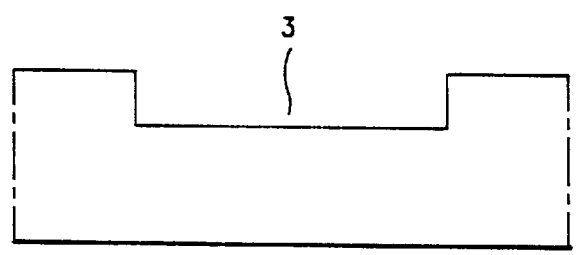
Figure 1C:
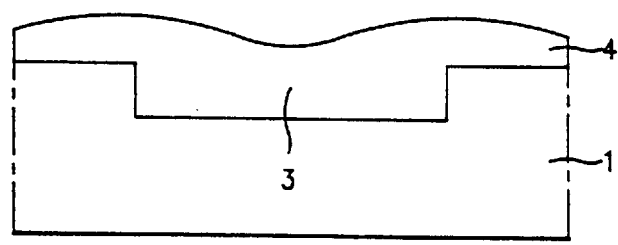
Figure 1D:
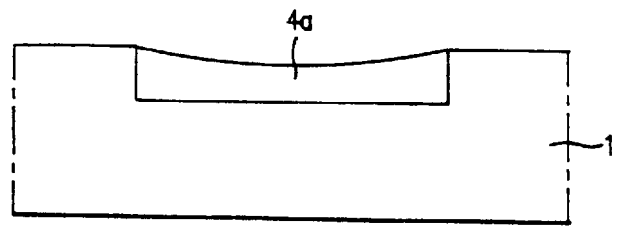

The novel features believed characteristic of the invention, as well as other features and advantages thereof, will best be understood by reference to the following detailed description of an exemplary embodiment, read in conjunction with the accompanying drawings, wherein:

FIGS. 1a to 1d are cross-sectional views showing a process of fabricating a conventional isolation layer of a semiconductor device;

FIG. 2 is a cross-sectional view of a structure of an isolation layer of a semiconductor device according to the present invention;

FIGS. 3a to 3g are cross-sectional views showing a process of fabricating an isolation layer of a semiconductor device according to a first embodiment of the present invention;

FIGS. 4a to 4e are cross-sectional views showing a process of fabricating an isolation layer of a semiconductor device according to a second embodiment of the present invention; and FIGS. 5a to 5e are cross-sectional views showing a process of fabricating an isolation layer of a semiconductor device according to a third embodiment of the present invention.

DETAILED DESCRIPTION OF PREFERRED EMBODIMENTS

Reference will now be made in detail to the preferred embodiments of the present invention, examples of which are illustrated in the accompanying drawings. Preferred embodiments of the present invention will be explained below with reference to the accompanying drawings. An isolation layer of the present invention includes a substrate, a first insulating layer having a predetermined width and thickness and being formed in a predetermined portion of the substrate, and a second insulating layer formed in a predetermined portion of the substrate to surround the first insulating layer. Here, the substrate is formed of one of semiconductor and insulating material. The first insulating layer is as thick as the second insulating layer, but may be thinner than the substrate. The first insulating layer is formed of one of nitride and oxide, and the second insulating layer is formed of one of oxide and nitride, respectively. That is, when the first insulating layer is formed of nitride, the second insulating layer is formed of oxide, and vice versa.

FIG. 2 is a cross-sectional view of a structure of an isolation layer of a semiconductor device according to the present invention. As shown in FIG. 2, the isolation layer of a semiconductor device of the present invention includes a first substrate 11, a second substrate 15 formed on the first substrate, a first insulating layer 12 formed in the second substrate, and a second insulating layer 16 formed in the second substrate to surround the first insulating layer. Here, the first substrate is formed of an insulating material or semiconductor. The first and second insulating layers are as thick as the second substrate. The first insulating layer is formed of one of nitride and oxide, and the second insulating layer is formed of the other one of oxide and nitride, respectively. That is, when the first insulating layer is formed of nitride, the second insulating layer is formed of oxide, and vice versa.

A method for forming an isolation layer of a semiconductor device according to a first embodiment of the present invention will be explained below. The method for forming an isolation layer of a semiconductor device according to the first embodiment of the present invention includes the steps of preparing a first substrate, forming a first insulating layer having a width narrower than that of the first substrate on the first substrate, forming a second substrate on the first substrate so that the second substrate has a predetermined space formed therein at each of multiple sides of the first insulating layer, and forming a second insulating layer within the spaces at the sides of the first insulating layer.

This method will be explained below in detail with reference to the accompanying drawings. FIGS. 3a to 3g are cross-sectional views showing a process of forming an isolation layer of a semiconductor device according to the first embodiment of the present invention.

As shown in FIG. 3a, a first insulating layer 12 is formed on a first substrate 11. Then, a photoresist (not shown) is coated on first insulating layer 12 and patterned. Next, a portion of first insulating layer 12 is selectively removed using the patterned photoresist as a mask to expose a predetermined portion of first substrate 11. As shown in FIG. 3b, a second insulating layer 13 is formed on the overall surface of first substrate 11 and on first insulating layer 12. Here, first insulating layer 12 is formed of one of oxide and nitride, and second insulating layer 13 is formed of one of nitride and oxide, respectively. That is, first and second insulating layers 12 and 13 are formed of different materials, such that when the first insulating layer is formed of nitride, the second insulating layer is formed of oxide, and vice versa.

Figure 3E:
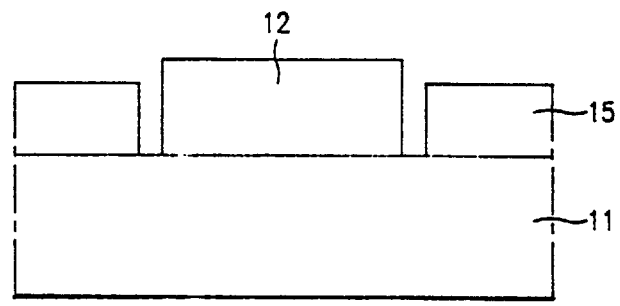

As shown in FIG. 3c, second insulating layer 13 is etched back to form a sidewall 14 on both sides of first insulating layer 12. Then, as shown in FIG. 3d, an epitaxial layer is grown on the exposed portion of first substrate 11, to form a second substrate 15. The epitaxial layer is formed of a single-crystalline layer of the material which forms the substrate 11. Here, the upper surface of second substrate 15 is formed to be lower than that of first insulating layer 12. That is, second substrate 15 is thinner than first insulating layer 12. As shown in FIG. 3e, sidewalls 14 are then removed using $H_3PO_4$.

Figure 3F:
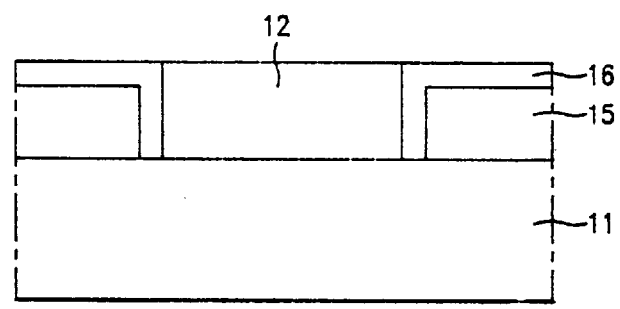
Figure 3G:
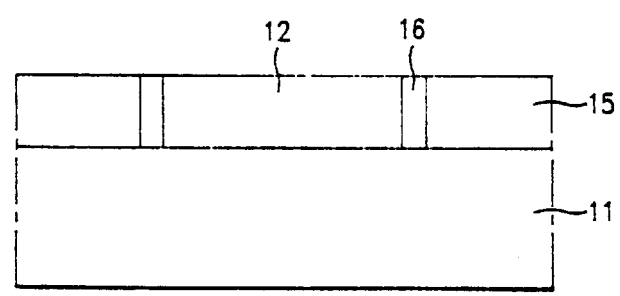

As shown in FIG. 3f, a thermal oxide layer 16 is formed on the overall surfaces of at least the first and second substrates through thermal oxidation. Specifically, thermal oxide layer 16 is formed on second substrate 15 and the exposed portion of first substrate 11. Then, thermal oxide layer 16 is removed to expose the surface of second substrate 15 and, at the same time, an upper portion of first insulating layer 12 is removed so that first insulating layer 12 is as thick as second substrate 15, thereby forming an isolation layer 12a of a semiconductor device.

A method for forming an isolation layer of a semiconductor device according to a second embodiment of the present invention will be explained below. The method for forming an isolation layer of a semiconductor device according to the second embodiment of the present invention includes the steps of preparing a first substrate, forming a first insulating layer having a width narrower than that of the first substrate on the first substrate, crystal-growing a second substrate on an exposed portion of the first substrate, selectively removing portions of the second substrate to form a predetermined space at each of multiple sides of the first insulating layer, and forming a second insulating layer within the spaces at the sides of the first insulating layer.

This method will be explained below in detail with reference to the accompanying drawings. FIGS. 4a to 4e are cross-sectional views showing a process of forming an isolation layer of a semiconductor device according to the second embodiment of the present invention.

As shown in FIG. 4a, a first insulating layer 22 is formed on a first substrate 21 through photolithography. Here, first insulating layer 22 is formed of one of oxide and nitride. Then, as shown in FIG. 4b, an epitaxial layer is grown on an exposed portion of first substrate 21 using a mask pattern 23, to form a second substrate 24. The epitaxial layer is formed of a single-crystalline layer of the material which forms the substrate 21. As shown in FIG. 4c, a photoresist pattern 25 is formed on the second substrate 24 for the purpose of forming a predetermined space on each side of first insulating layer 22.

As shown in FIG. 4d, portions of second substrate 24 within a predetermined space from each side of first insulating layer 22 are selectively etched. Then, as shown in FIG. 4e, a second insulating layer 26 is formed within the spaces from which second substrate 24 was selectively removed, completing the process. Here, second insulating layer 26 is formed of one of oxide and nitride. First and second insulating layers 22 and 26 are formed to be as thick as second substrate 24.

A method for forming an isolation layer of a semiconductor device according to a third embodiment of the present invention will be explained below. The method for forming an isolation layer of a semiconductor device according to the third embodiment of the present invention includes the steps of preparing a first substrate, forming a first insulating layer having a width narrower than that of the first substrate on the first substrate, depositing a conductive material on an exposed portion of the first substrate, to form a second substrate, removing portions of the second substrate to form a predetermined space at each of multiple sides of the first insulating layer, and forming a second insulating layer within the spaces at the sides of the first insulating layer.

This method will be explained below in detail with reference to the accompanying drawings. FIGS. 5a to 5e are cross-sectional views showing a process of forming an isolation layer of a semiconductor device according to the third embodiment of the present invention.

Figure 5A:
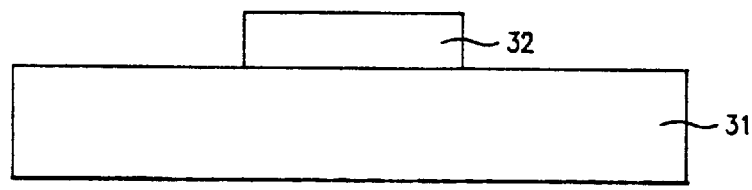
Figure 5B:
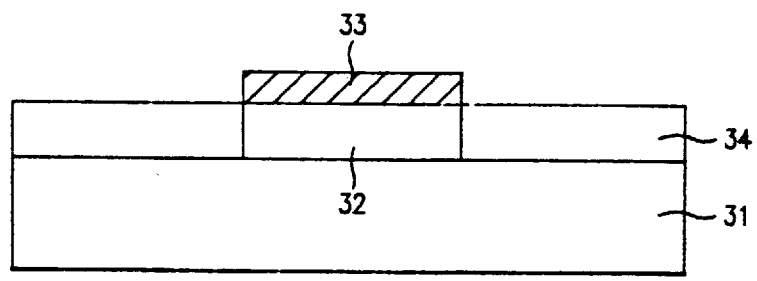

As shown in FIG. 5a, a first insulating layer 32 is formed a first substrate 31. Here, first substrate 31 is formed of one of semiconductor and insulating material. Then, a photoresist (not shown) is coated on first insulating layer 32 and patterned to have a predetermined width. First insulating layer 32 is etched using the patterned photoresist to expose a predetermined portion of substrate 31. Here, first insulating layer 32 is formed of one of oxide and nitride. As shown in FIG. 5b, a material 34 for forming a second substrate is deposited on the exposed portion of substrate 31 using a mask 33, to form second substrate 34. Here, second substrate 34 is formed of a conductive material.

Figure 5C:
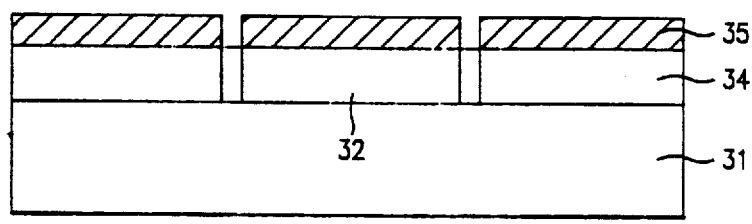
Figure 5D:
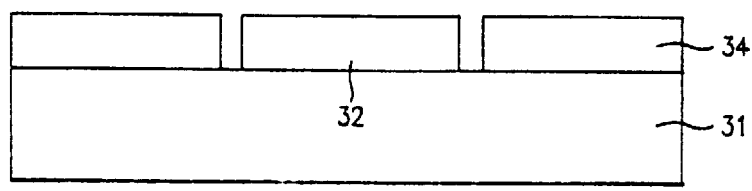
Figure 5E:
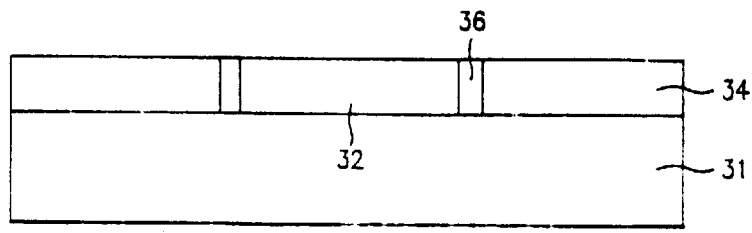

As shown in FIG. 5c, a photoresist pattern 35 is formed on second substrate 34 for the purpose of forming a predetermined space on each side of first insulating layer 32. Then, as shown in FIG. 5d, portions of second substrate 34 within a predetermined space from each side of first insulating layer 32 are selectively etched. As shown in FIG. 5e, second insulating layer 36 is formed within the spaces from which second substrate 34 was selectively removed, completing the process. Here, second insulating layer 36 is formed of one of oxide and nitride.

According to the present invention, an isolation layer having a uniform thickness can be formed. This improves the isolation characteristics the semiconductor device.

It will be apparent to those skilled in the art that various modifications and variations can be made in the isolation layer of semiconductor device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an isolation layer structure of a semiconductor device, the method comprising the steps of:
   preparing a first substrate;
   forming a first insulating layer having a width narrower than that of the first substrate on the first substrate;
   forming a second substrate directly on the first substrate so that the second substrate has a predetermined space formed therein on each of multiple sides of the first insulating layer; and
   forming a second insulating layer within the spaces on the sides of the first insulating layer.

2. The method of fabricating an isolation layer structure of a semiconductor device as claimed in claim 1, wherein the first substrate is formed of one of an insulating material and a semiconductor.

3. The method of fabricating an isolation layer structure of a semiconductor device as claimed in claim 1, wherein the first insulating layer is formed of one of nitride and oxide.

4. The method of fabricating an isolation layer structure of a semiconductor device as claimed in claim 1, wherein the second insulating layer is formed of one of nitride and oxide.

5. The method of fabricating an isolation layer structure of a semiconductor device as claimed in claim 1, wherein the second substrate is as thick as the first and second insulating layers.

6. A method of fabricating an isolation layer structure of a semiconductor device, the method comprising the steps of:
   preparing a first substrate;
   forming a first insulating layer having a width narrower than that of the first substrate on the first substrate;
   crystal-growing a second substrate on an exposed portion of the first substrate;
   selectively removing portions of the second substrate to form a predetermined space at each of multiples sides of the first insulating layer; and
   forming a second insulating layer within the spaces at the sides of the first insulating layer.

7. The method of fabricating an isolation layer structure of a semiconductor device as claimed in claim 6, wherein the second substrate is formed by epitaxial growth from the first substrate.

8. The method of fabricating an isolation layer structure of a semiconductor device as claimed in claim 6, wherein the first insulating layer is formed of one of nitride and oxide.

9. The method of fabricating an isolation layer structure of a semiconductor device as claimed in claim 6, wherein the second insulating layer is formed of one of nitride and oxide.

10. The method of fabricating an isolation layer structure of a semiconductor device as claimed in claim 6, wherein the second substrate is as thick as the first and second insulating layers.

11. A method of fabricating an isolation layer structure of a semiconductor device, the method comprising the steps of:
    preparing a first substrate;
    forming a first insulating layer having a width narrower than that of the first substrate on the first substrate;
    depositing a conductive material on an exposed portion of the first substrate, to form a second substrate;
    removing portions of the second substrate to form a predetermined space at each of multiple sides of the first insulating layer; and
    forming a second insulating layer within the spaces at the sides of the first insulating layer.

12. The method of fabricating an isolation layer structure of a semiconductor device as claimed in claim 11, wherein the first substrate is formed of one of an insulating material and a semiconductor.

13. The method of fabricating an isolation layer structure of a semiconductor device as claimed in claim 11, wherein the second substrate is as thick as the first and second insulating layers.

14. The method of fabricating an isolation layer structure of a semiconductor device as claimed in claim 11, wherein the first insulating layer is formed of one of nitride and oxide.

15. The method of fabricating an isolation layer structure of a semiconductor device as claimed in claim 11, wherein the second insulating layer is formed of one of nitride and oxide.

16. The method of fabricating an isolation layer structure of a semiconductor device as claimed in claim 1, wherein the step of forming a second substrate directly on the first substrate includes forming the second substrate from a conductive material.

17. The method of fabricating an isolation layer structure of a semiconductor device as claimed in claim 1, wherein the step of forming a second substrate directly on the first substrate includes forming the second substrate having the same material structure as the first substrate.

18. The method of fabricating an isolation layer structure of a semiconductor device as claimed in claim 1, wherein the step of forming a second substrate directly on the first substrate includes forming the second substrate by epitaxially growing a layer of crystalline semiconductor.

* * * * *